(12) United States Patent
Hsieh et al.

(10) Patent No.: US 11,658,271 B2
(45) Date of Patent: May 23, 2023

(54) DUV LED MODULE STRUCTURE

(71) Applicant: Cheng Mei Optronics Inc., Tianzhong Township, Changhua County (TW)

(72) Inventors: Bin-Chun Hsieh, Tianzhong Township (TW); Siang-Jyun Chen, Tianzhong Township (TW); Sin-yu Chen, Tianzhong Township (TW)

(73) Assignee: Cheng Mei Optronics Inc., Tianzhong Township (TW)

( * ) Notice: Subject to any disclaimer, the term of this patent is extended or adjusted under 35 U.S.C. 154(b) by 179 days.

(21) Appl. No.: 17/220,979

(22) Filed: Apr. 2, 2021

(65) Prior Publication Data
US 2021/0320230 A1   Oct. 14, 2021

(30) Foreign Application Priority Data

Apr. 9, 2020   (TW) ................................. 109112302

(51) Int. Cl.
| | |
|---|---|
| *H01L 33/48* | (2010.01) |
| *H01L 25/16* | (2023.01) |
| *H01L 33/64* | (2010.01) |
| *H01L 33/58* | (2010.01) |
| *H01L 33/60* | (2010.01) |

(52) U.S. Cl.
CPC .......... *H01L 33/486* (2013.01); *H01L 25/165* (2013.01); *H01L 25/167* (2013.01); *H01L 33/58* (2013.01); *H01L 33/60* (2013.01); *H01L 33/642* (2013.01)

(58) Field of Classification Search
CPC ... H01L 33/486; H01L 25/165; H01L 25/167; H01L 33/58; H01L 33/60; H01L 33/642
See application file for complete search history.

(56) References Cited

U.S. PATENT DOCUMENTS

2016/0155907 A1* 6/2016 Ozeki ..................... H01L 33/62
257/98
2018/0346348 A1* 12/2018 Collins ..................... C02F 1/36

FOREIGN PATENT DOCUMENTS

| CN | 205960022 U | 2/2017 |
|---|---|---|
| CN | 208904057 U | 5/2019 |

* cited by examiner

*Primary Examiner* — Jay C Chang
*Assistant Examiner* — Mikka Liu
(74) *Attorney, Agent, or Firm* — Alan D. Kamrath; Karin L. Williams; Mayer & Williams PC

(57) ABSTRACT

A deep ultraviolet (DUV) light-emitting diode (LED) module structure contains: a holder configured to accommodate a substrate. The holder including a receiving cup mounted therein and a transparent layer mounted on a top of the receiving cup. The holder includes a DUV LED chip adhered on the substrate, and the holder, the substrate, and the DUV LED chip are connected and packaged. The substrate is electrically connected with a drive circuit, and the drive circuit is configured to turn on/off the DUV LED chip. Thereby, the DUV LED module structure enhances DUV radiation intensity, reduces a loss of optical path, and slows down deterioration because of DUV irradiation.

15 Claims, 3 Drawing Sheets

DUV LED MODULE STRUCTURE

FIELD OF THE INVENTION

The present invention relates to a connection of a semiconductor and a mechanism, and more particularly to a deep ultraviolet (DUV) light-emitting diode (LED) module structure.

BACKGROUND OF THE INVENTION

A light-emitting diode (referred to as LED module) is a solid semiconductor light-emitting device. With development, the LED module band has gradually developed from the original red and blue monochromatic wavelengths to ultraviolet (UV) and deep ultraviolet (DUV).

The deep ultraviolet (DUV) light-emitting diode (LED) is applicable for purification and sterilization, especially for air, water, food or medical supplies.

With reference to FIG. 1, the DUV LED package structure contains a substrate 11, at least one DUV LED chip 12, and a quartz glass 13 which are packaged by adhesive material. The DUV LED package structure is packaged by inorganic materials. The quartz glass 13 and the substrate 11 are metallized before being adhered, and the quartz glass 13, the adhesive materials, and the substrate 11 are pressed and adhered in a high temperature so as to avoid water vapors and pollution, thus causing difficult inorganic packaging and high sealing cost.

To overcome the difficult packaging, an adhering package has developed to eliminate organic materials (such as the quartz glass 13, silicone, and rubber) when in a press packaging process, thus simplifying manufacture process and enhancing product yield. However, the organic materials are deteriorated after being illuminated by DUV LED to lose protection of the LED chip, such as DUV LED chip.

A UV LED is disclosed in CN Utility Model No. 2059600220, and a package structure of a UV LED lamp bead is disclosed in CN Utility Model No. CN208904057U and is capable of improving aging of organic materials after being illuminated by DUV.

Referring to FIG. 1, the package material is selected and produced limitedly, for example, when lights emits into a receiving cup from a DUV LED chip 12 and penetrates through an external environment via the quartz glass 13, an angle and a reflectivity of the substrate and a light transmittance of the quartz glass influence light extraction efficiency greatly.

Moreover, an external quantum efficiency and electro-optical conversion efficiency of the DUV LED are less than 3%.

The present invention has arisen to mitigate and/or obviate the afore-described disadvantages.

SUMMARY OF THE INVENTION

The primary aspect of the present invention is to provide a deep ultraviolet (DUV) light-emitting diode (LED) module structure which enhances DUV radiation intensity, reduces a loss of optical path, and slows down deterioration because of DUV irradiation.

To obtain above-mentioned aspects, a deep ultraviolet (DUV) light-emitting diode (LED) module structure provided by the present invention contains: a holder configured to accommodate a substrate, and the holder includes a receiving cup mounted therein and a transparent layer mounted on a top of the receiving cup.

The holder includes a DUV LED chip adhered on the substrate, and the holder, the substrate, and the DUV LED chip are connected and packaged.

Preferably, the substrate is electrically connected with a drive circuit, and the drive circuit is configured to turn on/off the DUV LED chip.

Preferably, the transparent layer is located on a specific angle with respect to the receiving cup so that DUV LEDs of the DUV LED chip emits lights at different angles or in a single direction to enhance reflectivity and light extraction efficiency.

Preferably, the substrate is made of conductively inorganic material or fluorine-based material, and the conductively inorganic material is ceramics or aluminum.

Preferably, a heat dissipation element is connected with a bottom of the substrate so as to dissipate heat to an external environment and to prolong a service life.

Preferably, the transparent layer is a flat lens or a flat film, and the transparent layer is made of transparent material and has a beam angle.

Preferably, the receiving cup is adjustable to a desired angle based on using requirements, thus adjusting radiation intensity.

Preferably, the DUV LED chip is connected with any one of white LEDs, infrared LED, and a combination of the white LEDs and the infrared LED.

DETAILED DESCRIPTION OF THE PREFERRED EMBODIMENTS

Figure 1:
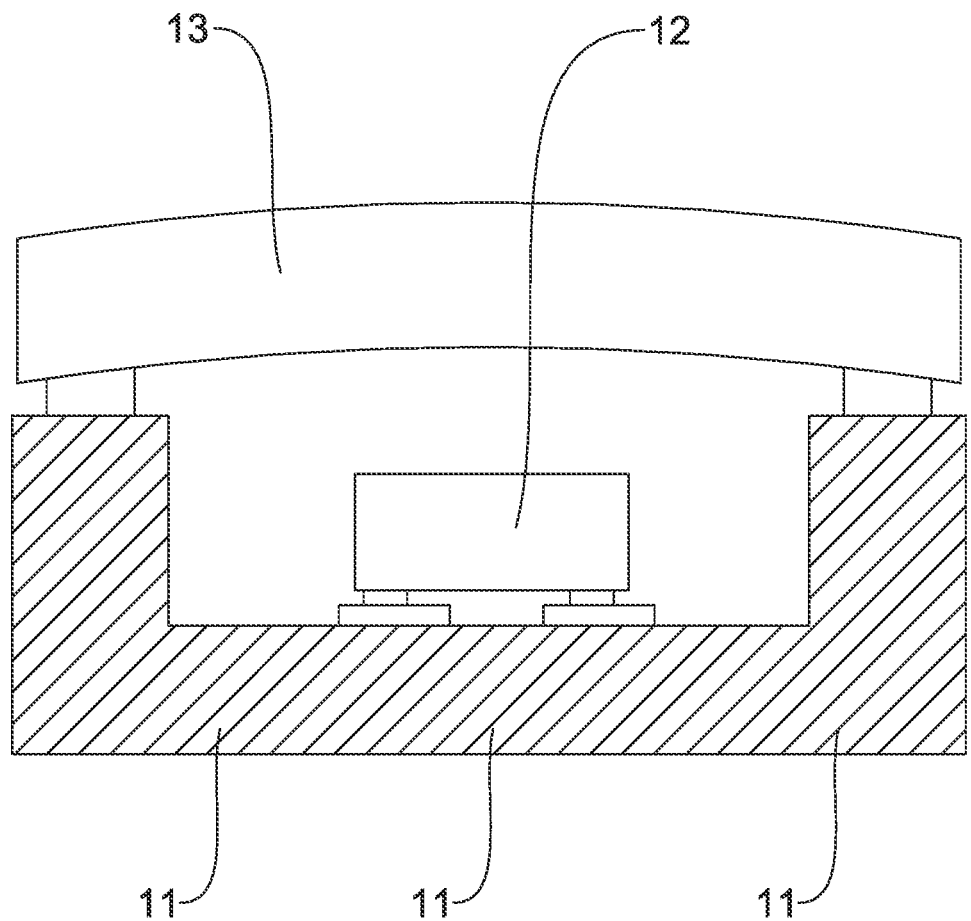
FIG. 1 is a cross sectional view showing the assembly of a conventional deep ultraviolet (DUV) light-emitting diode (LED).
Figure 2:
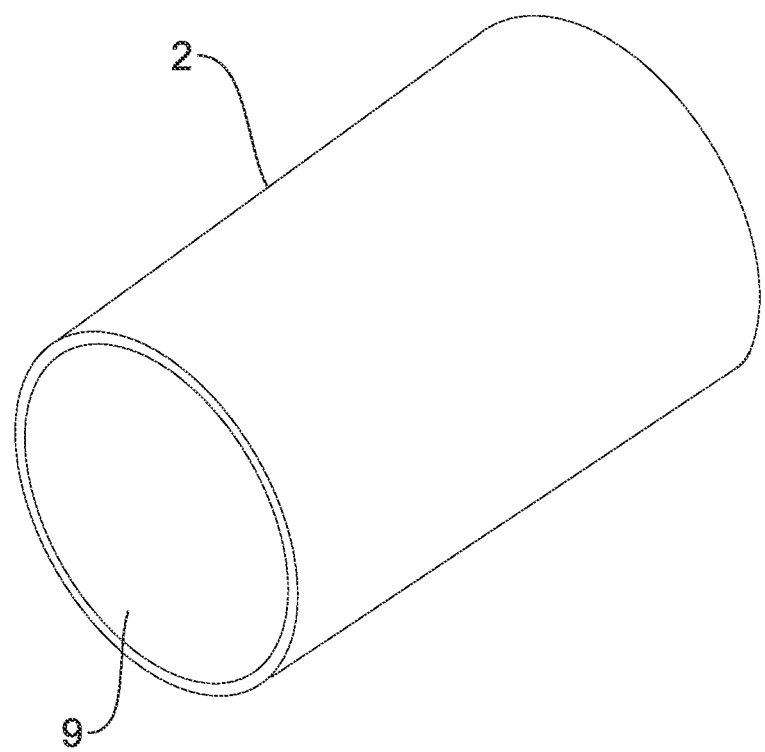
FIG. 2 is a perspective view showing the assembly of a deep ultraviolet (DUV) light-emitting diode (LED) according to a preferred embodiment of the present invention.
Figure 3:
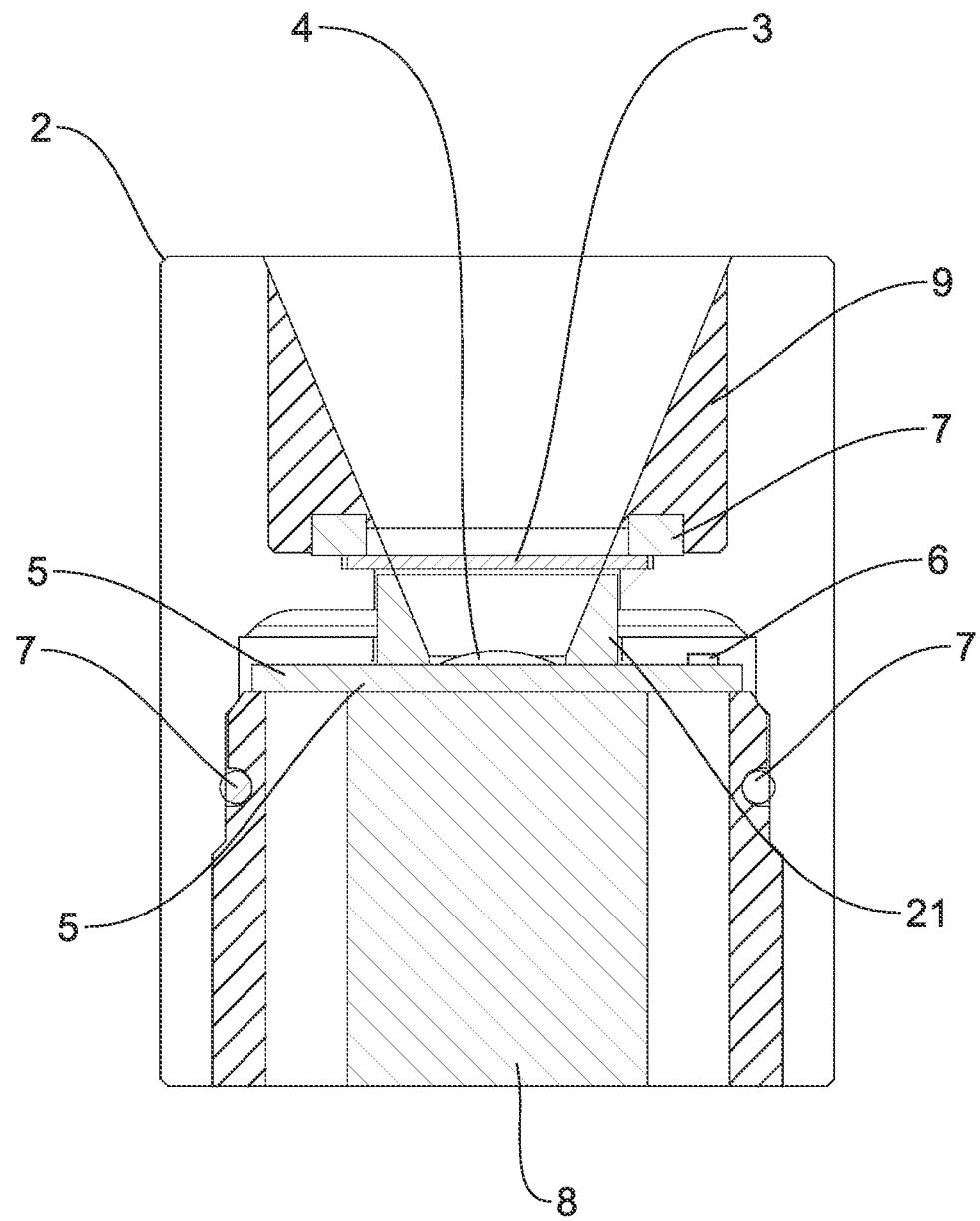
FIG. 3 is a perspective view showing the assembly of the deep ultraviolet (DUV) light-emitting diode (LED) according to the preferred embodiment of the present invention.

With reference to FIGS. 2 and 3, a deep ultraviolet (DUV) light-emitting diode (LED) module structure according to a preferred embodiment of the present invention comprises: a holder 2, a transparent layer 3, a DUV LED chip 4, and a substrate 5.

The holder 2 is configured to accommodate the substrate 5, and the holder 2 includes a receiving cup 21 mounted therein and is configured to receive an object which is illuminated by UV equipment, such as a background germicidal lamp or a reverse osmosis (RO) germicidal lamp which is configured to sterilize/disinfect. In another embodiment, the holder 2 includes an outer threaded portion or a detachable engagement portion or the holder 2 is fixed by a screw. Referring to FIGS. 2 and 3, the substrate 2 is formed in a cylinder shape.

In addition, as shown in FIGS. 2 and 3, the receiving cup 21 has a specific angle. For example, the receiving cup 21 is adjustable to a desired angle, thus illuminating the object at the desired angle.

As illustrated in FIGS. 2 and 3, the transparent layer 3 is mounted on a top of the receiving cup 21 and is a flat lens or a flat film, and the transparent layer 3 is made of transparent material and has a beam angle, wherein the transparent layer 3 is fluorine-based material or anti-UV material, such as quartz glass. Preferably, the transparent layer 3 has different beam angles and is connected with the holder 2 via at least one washer 7.

Referring to FIG. 3, the DUV LED chip 4 is adhered on the substrate 5 and includes deep ultraviolet (DUV) light-emitting diodes (LEDs), such that the DUV LEDs of the DUV LED chip 4 emit deep ultraviolet (DUV) which is refracted completely via the receiving cup 21 to reduce a loss of optical path. In addition, the receiving cup 21 guides the DUV of the DUV LED chip 4 to an external environment.

As shown in FIG. 3, at least one drive circuit 6 is connected with the substrate 5 and is configured to turn on/off the DUV LED chip 4 (such an arrangement is called as DUV LED Driver on Board (DL-DOB)). The at least one washer 7 is fixed in the holder 2 so as to stop water vapors and polluted airs, thus preventing optical loss.

As illustrated in FIG. 3, the substrate 5 is made of conductively inorganic material (such as ceramics, aluminum or copper) or organic material which is configured to stop DUV.

With reference to FIG. 3, the drive circuit 6 is connected with the substrate 5 in a welding manner. Furthermore, a heat dissipation element 8 is connected with the DUV LED chip 4 so as to dissipate heat, thus preventing thermal damage and prolonging a service life of the DUV LED chip.

Referring to FIG. 3, the holder 2, the transparent layer 3, the DUV LED chip 4, the substrate 5, the drive circuit 6, the at least one washer 7, and the heat dissipation element 8 are connected and packaged.

As shown in FIG. 3, the transparent layer 3 includes a press sheet 9 mounted on a top thereof, having a specific reflection angle, and configured to fix the transparent layer 3.

Accordingly, the DUV LED module structure of the present invention has advantages as follows:

1). The DUV LED chip 4 is disposed on the substrate 5 to as to reduce inorganic or organic package cost.

2). The holder 2 of the DUV LED module structure is not illuminated by the DUV by using the organic material, anti-DUV transparent material, and highly reflective material, thus avoiding illuminating the holder when packaging the DUV LED module structure inorganically or organically.

3). The DUV module, mechanism, and electric circuit are integrally modularized to produce the DUV LED module structure easily.

4) The DUV LED module structure is packaged easily, produced at a low cost, has low reflectivity to the holder, and the holder is vertical and the transparent layer is the flat lens or film so as to reduce the loss of optical path and optical loss.

5). The DUV LED chip 4 is connected with the DUV LEDs, white LEDs, infrared LED based on using requirements, or a combination of the white LEDs and the infrared LED.

While the preferred embodiments of the invention have been set forth for purpose of disclosure, modifications of the disclosed embodiments of the invention and other embodiments thereof may occur to those skilled in the art. Accordingly, the appended claims are intended to cover all embodiments which do not depart from the spirit and scope of the invention.

What is claimed is:

1. A deep ultraviolet (DUV) light-emitting diode (LED) module structure comprising:
   a holder configured to accommodate a substrate, and the holder including a receiving cup mounted therein and a transparent layer mounted on a top of the receiving cup;
   wherein the holder includes a DUV LED chip adhered on the substrate, and the holder, the substrate, and the DUV LED chip are connected and packaged, and
   wherein the transparent layer includes a press sheet mounted on a top thereof, having a specific reflection angle, and configured to fix the transparent layer.

2. The DUV LED module structure as claimed in claim 1, wherein the substrate is electrically connected with a drive circuit, and the drive circuit is configured to turn on/off the DUV LED chip.

3. The DUV LED module structure as claimed in claim 1, wherein the transparent layer is located on a specific angle with respect to the receiving cup so that DUV LEDs of the DUV LED chip emit lights at different angles or in a single direction to enhance reflectivity and light extraction efficiency.

4. The DUV LED module structure as claimed in claim 1, wherein the substrate is made of conductively inorganic material or fluorine-based material, and the conductively inorganic material is ceramics or aluminum.

5. The DUV LED module structure as claimed in claim 1, wherein a heat dissipation element is connected with a bottom of the substrate so as to dissipate heat to an external environment.

6. The DUV LED module structure as claimed in claim 1, wherein the transparent layer is a flat lens or a flat film, and the transparent layer is made of transparent material and has a beam angle.

7. The DUV LED module structure as claimed in claim 1, wherein the receiving cup is adjustable to a desired angle based on using requirements, thus adjusting radiation intensity.

8. A deep ultraviolet (DUV) light-emitting diode (LED) module structure comprising:
   a holder configured to accommodate a substrate, and the holder including a receiving cup mounted therein and a transparent layer mounted on a top of the receiving cup;
   wherein the holder includes a DUV LED chip adhered on the substrate, and the holder, the substrate, and the DUV LED chip are connected and packaged,
   wherein the DUV LED chip is connected with any one of white LEDs, infrared LED, and a combination of the white LEDs and the infrared LED.

9. The DUV LED module structure as claimed in claim 8, wherein the substrate is electrically connected with a drive circuit, and the drive circuit is configured to turn on/off the DUV LED chip.

10. The DUV LED module structure as claimed in claim 8, wherein the transparent layer is located on a specific angle with respect to the receiving cup so that DUV LEDs of the DUV LED chip emit lights at different angles or in a single direction to enhance reflectivity and light extraction efficiency.

11. The DUV LED module structure as claimed in claim 8, wherein the substrate is made of conductively inorganic material or fluorine-based material, and the conductively inorganic material is ceramics or aluminum.

12. The DUV LED module structure as claimed in claim 8, wherein a heat dissipation element is connected with a bottom of the substrate so as to dissipate heat to an external environment.

13. The DUV LED module structure as claimed in claim 8, wherein the transparent layer is a flat lens or a flat film, and the transparent layer is made of transparent material and has a beam angle.

14. The DUV LED module structure as claimed in claim 8, wherein the receiving cup is adjustable to a desired angle based on using requirements, thus adjusting radiation intensity.

15. The DUV LED module structure as claimed in claim 8, wherein the transparent layer includes a press sheet mounted on a top thereof, having a specific reflection angle, and configured to fix the transparent layer.

* * * * *